United States Patent
Komaki

(10) Patent No.: US 6,553,553 B2
(45) Date of Patent: Apr. 22, 2003

(54) METHOD OF DESIGNING LAYOUT OF SEMICONDUCTOR DEVICE

(75) Inventor: Masaki Komaki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 31 days.

(21) Appl. No.: 09/768,365

(22) Filed: Jan. 25, 2001

(65) Prior Publication Data

US 2001/0056569 A1 Dec. 27, 2001

(30) Foreign Application Priority Data

Jun. 14, 2000 (JP) .................... 2000-178392

(51) Int. Cl.[7] .............................................. G06F 17/50
(52) U.S. Cl. ........................................ 716/10; 716/8
(58) Field of Search ...................... 716/1–14, 17; 326/39

(56) References Cited

U.S. PATENT DOCUMENTS

| | | | | |
|---|---|---|---|---|
| 5,012,427 A | * | 4/1991 | Kuribayashi | 716/17 |
| 6,054,872 A | * | 4/2000 | Fudanuki et al. | 326/39 |
| 6,308,307 B1 | * | 10/2001 | Cano et al. | 716/8 |

FOREIGN PATENT DOCUMENTS

| JP | 01140640 A | * | 6/1989 | .......... H01L/21/82 |
|---|---|---|---|---|
| JP | 08138383 A | * | 5/1996 | .......... G11C/11/417 |
| JP | 10074840 A | * | 3/1998 | .......... H01L/21/82 |
| JP | 10092940 A | * | 4/1998 | .......... H01L/21/82 |
| JP | 2001284456 A | * | 10/2001 | .......... H01L/21/82 |

* cited by examiner

Primary Examiner—Matthew Smith
Assistant Examiner—Lin Sun James
(74) Attorney, Agent, or Firm—Staas & Halsey LLP

(57) ABSTRACT

This invention provides a method and system for designing the layout of a semiconductor device that appropriately arranges various types of auxiliary cells in vacant areas. The method of the present invention is devised for laying out a plurality of auxiliary cells between logic cells in a semiconductor device. The present invention further provides an apparatus comprising a processor configured to carry out the inventive method. The apparatus of the present invention may include a cell library in which the auxiliary cells are registered and dummy cells are utilized. The present invention additionally provides a computer readable storage medium, containing a program code instructed to perform the method of the present invention.

26 Claims, 3 Drawing Sheets

| Aux.Cell Group Type | Dimension | | | | |
|---|---|---|---|---|---|
| Spacer Cell 21 | B | | | | |
| Master Bulk Cell 22 | | | C1 | C2 | |
| Diode Cell 23 | | D1 | D2 | | |
| Capacitance 24 | | E1 | E2 | E3 | E4 |
| Filter Cell 25 | | F1 | F2 | F3 | F4 |
| Dummy Cell 26 | | X1 | X2 | X3 | X4 | X5 |

Fig.5

| A | | A | | X3 | A | | | X3 | A | |
|---|---|---|---|---|---|---|---|---|---|---|
| A | | | X4 | | X1 | A | | A | | A |
| A | X4 | | A | A | | X3 | A | A | X3 | A | A |
| A | A | A | | X4 | | A | | A | | X3 | X1 | A |
| A | | X3 | A | | | X3 | A | | X4 | | X3 | A |
| A | A | | X3 | A | | A | X3 | X1 | A | | | A |

| A | | A | | C1 | A | | | C1 | A | |
|---|---|---|---|---|---|---|---|---|---|---|
| A | | | E3 | | B | A | | A | | A |
| A | E3 | | A | A | | C1 | A | A | C1 | A | A |
| A | A | A | | E3 | | A | | A | | C1 | B | A |
| A | | C1 | A | | | C1 | A | | E3 | | C1 | A |
| A | A | | C1 | A | | A | C1 | B | A | | | A |

~42

METHOD OF DESIGNING LAYOUT OF SEMICONDUCTOR DEVICE

BACKGROUND OF THE INVENTION

The present invention relates to a method for designing the layout of a semiconductor device, and particularly, to a method for designing the layout of a standard cell semiconductor device.

FIG. 1 is a schematic diagram showing the layout of a prior art standard cell semiconductor device 1. The semiconductor device 1 includes a plurality of cell rows 2. To lay out logic cells A, which are provided with logic functions, the logic cells A are first arranged in each cell row 2. Then, spacer cells B are arranged in vacant areas that are not occupied by-the logic cells A (vacant areas) to connect the logic cells A to a power source (not shown). The spacer cells B each includes dimension data and power line data. The spacer cells B are arranged to correspond with the dimensions of the vacant areas to connect the power lines of the logic cells A.

In recent years the scale of semiconductor device 1 has been increasing. This has resulted in the arrangement having auxiliary functions on the semiconductor device 1. Auxiliary cells may include, for example, a master slice basic cell for making logic changes or for adjusting timing with metal modification, an antenna effect diode cell for preventing characteristic deterioration during the fabrication process, and capacitance cells for preventing power supply noise.

The size of each vacant area is determined by the layout of the logic cells A. Each type of auxiliary cells has a different size. Thus, it is difficult to arrange auxiliary cells of different dimensions, and the designing of the semiconductor device 1 may be time consuming.

SUMMARY OF THE INVENTION

This invention provides a method and system for designing the layout of a semiconductor device that appropriately arranges various types of auxiliary cells in vacant areas. The method of the present invention is devised for laying out a plurality of auxiliary cells between logic cells in a semiconductor device, wherein the auxiliary cells include representative auxiliary cells and each of the auxiliary cells has a predetermined dimension.

The method of the present invention entails the following steps: 1) temporarily arranging the representative auxiliary cells in a plurality of vacant areas that are not occupied by the logic cells; 2) obtaining the number and the total area of the temporarily arranged representative auxiliary cells having the same dimension; and 3) arranging a plurality of the functional auxiliary cells in place of the temporarily arranged representative auxiliary cells, based on the number and total area of the representative auxiliary-cells having the same dimension and the specification of the semiconductor device, wherein each of the functional auxiliary cell has a dimension and a function that are in accordance with the dimension and a selected function of its corresponding temporarily arranged representative auxiliary cell.

In the method of the present invention, the temporary arrangement of the representative auxiliary cells can be carried out by arranging the representative auxiliary cells largest to smallest in dimension. Moreover, the auxiliary cells can be registered in a cell library and include dummy cells used for the temporary arrangement, wherein each of the dummy cells has only dimension-related data. Further, the functional auxiliary cells can be arranged, for instance, after deleting the temporarily arranged representative auxiliary cells; or exchanged with the temporarily arranged representative auxiliary cells, wherein the exchanged auxiliary cells have the same dimensions. And the arranging step includes selecting a functional auxiliary cell for each of the temporary arranged representative auxiliary cells.

The present invention provides an apparatus includes a processor configured to carry out the above method. In the apparatus of the present invention, the auxiliary cells may be registered in a cell library and include dummy cells used for the temporary arrangement, wherein each of the dummy cells has only dimension-related data.

The present invention further provides a computer readable storage medium, containing a program code instructed to perform the method described above.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 5 is a schematic diagram showing an exemplary embodiment of a layout of logic cells and dummy cells in a semiconductor device according to the present invention; and FIG. 6 is a schematic c diagram of the semiconductor device of FIG. 5 in which dummy cells are replaced by functional cells.

DETAILED DESCRIPTION OF THE PREFERRED EMBODIMENT

Figure 1:
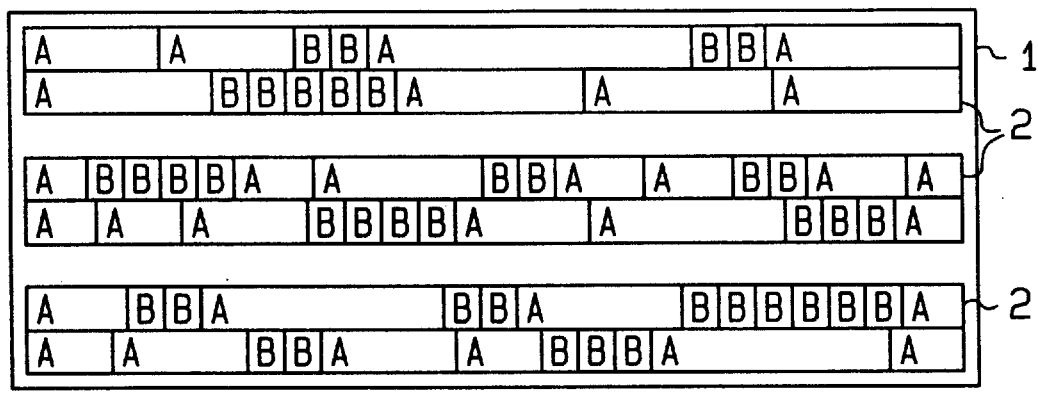
FIG. 1 is a schematic diagram showing a prior art semiconductor device in which logic cells and spacer cells are arranged.

A preferred embodiment according to the present invention will now be described with reference to FIGS. 2 to 6. FIG. 3 is a schematic block diagram of a computer system 11 that executes a cell layout designing process according to a preferred embodiment of the present invention. The computer system 11 includes a processor 12, an input device 13, a display 14, a first memory 15, a second memory 16, a third memory 17, and a fourth memory 18. In computer system 11, the input device 13, the display 14, and the first to fourth memories 15–18 are all connected to the processor 12.

The input device 13, which is used to start programs and to input parameters and commands of an operator, can be a keyboard, or a mouse (neither shown) The display 14 is an output device, such as a Video Display Terminal (VDT), a monitor, or a printer, which is able to display the pattern of a semiconductor device, a layout processing result, and a parameter input display.

The first memory 15, the second memory 16, the third memory 17 and the fourth memory 18 can be selected from the group consisting of magnetic tape devices, magnetic disk devices, optical disk devices, and magneto-optical disks. The first memory 15, and the second memory 16 respectively store program data 15a and a cell library 16a. The third memory 17 stores layout data 17a and specification data 17b. The forth memory 18 stores layout data 18a. Each of the first to fourth memories 15–18 may store the associated data by dividing it into a plurality of fragmented data.

The program data 15a stored in the first memory 15 is used to design the layout of different types of auxiliary cells. Further, the program data 15a may be formed from a plurality of program modules or may be a Computer Assisted Design (CAD) program data used as a single module.

The program data 15a is stored in a storage medium 19 and provided to the first memory 15 from the storage medium 19. The processor 12 operates a drive device (not shown) in storage medium 19 to load the program data 15a to the first memory 15 and to execute the program. The processor 12 may also directly receive the program data 15a from the storage medium 19.

With reference to FIG. 4, first auxiliary-cell-group 21, second auxiliary-cell-group 22, third auxiliary-cell-group 23, forth auxiliary-cell-group 24, fifth auxiliary-cell-group 25 and sixth auxiliary-cell-group 26 are registered in the cell library 16a of the second memory 16 (see FIG. 3). The first to fifth auxiliary-cell-groups 21–25 each include one or more cells (B, C1, C2, D1, D2, E1–E4, F1–F4), each cell having a single function. The sixth auxiliary-cell-group 26 includes a plurality of dummy cells X1–X5, each of which may be used to fill in a dimension. Predetermined in accordance with its function, each of the cells in the first to fifth auxiliary-cell-groups 21–25 is characterized by dimension.

The cell library 16a (in FIG. 3) also stores the dimension data of each cell (in FIG. 4). The dimension of each dummy cell in the sixth auxiliary-cell-group 26 corresponds to the dimension of at least one cell in the first to fifth auxiliary-cell-groups 21–25.

The first auxiliary-cell-group 21 has a spacer cell B having dimension data and power line data.

The second auxiliary-cell-group 22 includes a first master bulk cell C1 and a second master bulk cell C2, each of which are used to improve wiring. Each of the master bulk cells C1, C2 has a dimension corresponding to its inherent characteristic (transistor number).

The third auxiliary-cell-group 23 includes a first diode cell D1 and a second diode cell D2, to counter antenna effects. Each of diode cells D1, D2 has a dimension corresponding to its inherent characteristics. The dimension of the second diode cell D2 is substantially the same as that of the first master bulk cell C1.

The fourth auxiliary-cell-group 24 includes a first capacitance cell E1, a second capacitance cell E2, a third capacitance cell E3, and a fourth capacitance cell E4, which are designed to reduce power drops. Each of the capacitance cells E–E4 has a dimension corresponding to its inherent characteristic (capacitance).

The fifth auxiliary-cell-group 25 includes a first filter cell F1, a second filter cell F2, a third filter cell F3 and a fourth filter cell F4, for the purpose of eliminating high frequency components in power supply noises. Each of the filter cells F1–F4 has a dimension corresponding to its inherent characteristic (capacitance and resistance). The first filter cell F1, the second filter cell F2, the third filter cell F3 and the fourth filter cell F4 have dimensions that are substantially the same as the respective dimensions of the first capacitance cell E1, the second capacitance cell E2, the third capacitance cell E3, and the fourth capacitance cell E4.

The sixth auxiliary cell group 26 includes a first dummy cell X1, a second dummy cell X2, a third dummy cell X3, a forth dummy cell X4 and a fifth dummy cell X5. The first dummy cell X1 has substantially the same dimension as that of the spacer cell B, and the second to fifth dummy cells X2–X5 have substantially the same dimensions as the respective dimensions of the first to fourth filter cells F1–F4. The dummy cells X1–X5 have reference dimensions and function as representative cells.

Now referring back to FIG. 3, the third memory 17 stores the layout data (processing subject data) 17a, and specification data 17b of the semiconductor device in which logic cells A are arranged. The layout data 17a contains a layout of logic cells A arranged by the processor 12 in accordance with the specification data 17b. The layout data 17a may also be generated by another CAD system.

The processor 12 arranges the auxiliary cells registered in the cell library 16a by using the specification data 17b and the layout data 17a. Then, the processor 12 stores the layout data 17a (processed data) of the auxiliary cells in the fourth memory 18.

The layout designing process of the auxiliary cells (the cells shown in FIG. 4) will now be discussed with reference to the flowchart of FIG. 2 and the schematic diagrams of FIGS. 5 and 6.

Figure 2:
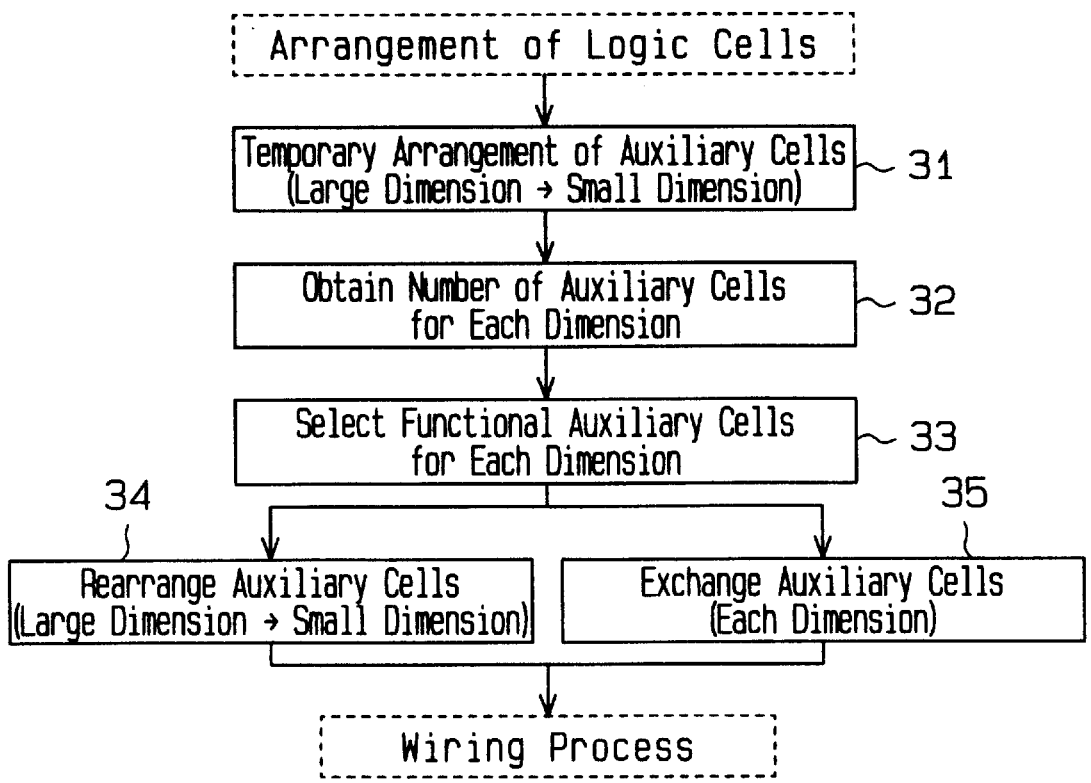
FIG. 2 is a flowchart illustrating an exemplary embodiment of a method for arranging cells in accordance with a preferred embodiment of the present invention.
Figures 3, 4:
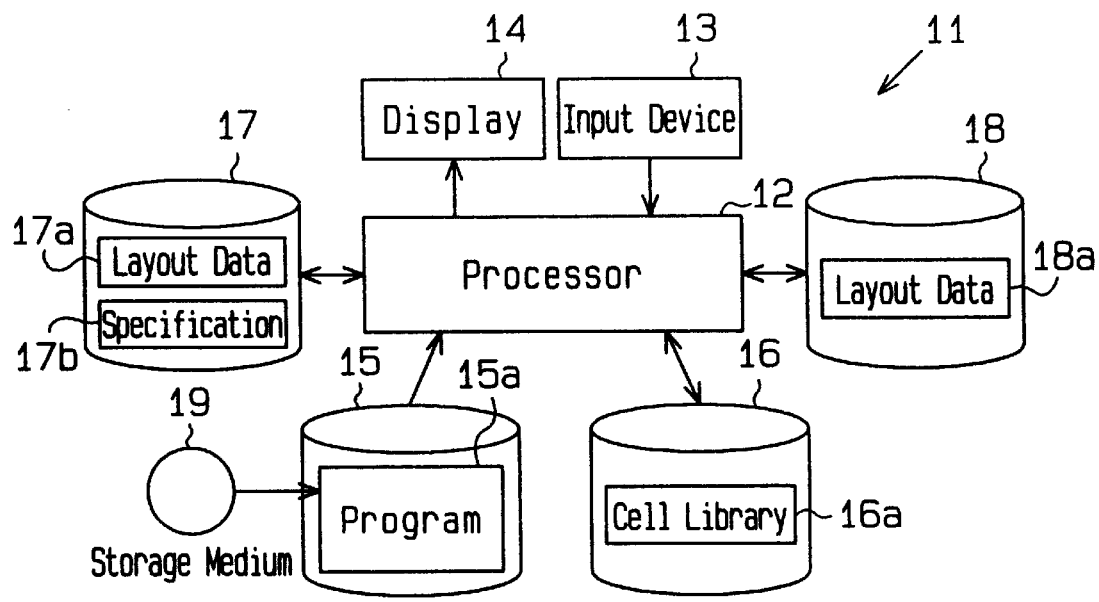
FIG. 3 is a schematic block diagram of a computer system that executes the flowchart of FIG. 2.
FIG. 4 is a table showing exemplary types and dimensions of auxiliary cells.

In FIG. 2, steps 31, 32, 33, 34 and 35 are performed after the logic cells A are laid out. The processor 12 (in FIG. 3) uses layout data 17a and specification data 17b generated during laying out the logic cells A to arrange the auxiliary cells in accordance with the specification of the semiconductor device.

In step 31, the auxiliary cells (shown in FIG. 4) are laid out temporarily. Specifically, the processor 12 sequentially arranges the auxiliary representative cells in the vacant areas by cells largest to smallest in size. For example, the processor 12 arranges the fifth dummy cells X5, first largest in size, in the vacant areas. The forth dummy cells X4, second largest in size, are then arranged in the remaining vacant areas. If a dummy cell is too large to be laid out in a vacant area, the dummy cell is not laid out.

In FIG. 5, the vacant areas are smaller than the dummy cells X5. Thus, the dummy cells X5 are not being laid out. In this manner, the auxiliary representative cells are laid out by cells largest to smallest in size in step 31. Consequently, the designing of a semiconductor device layout 41, where vacant areas are all occupied by auxiliary representative cells (the dummy cells X1, X3, X4), is completed. Accordingly, auxiliary representative cells having different sizes are arranged effectively within a short period of time.

In step 32, the number of the auxiliary representative cells is obtained. Specifically, the processor 12 obtains the number and total area of the temporarily laid out auxiliary representative cells for each size. In the embodiment of FIG. 5, the processor 12 obtains the number of the dummy cells X1, X3, X4 (3, 10, 4) and the total area of the dummy cells X1, X3, X4 (3, 20, 16), where the area of the spacer cell B corresponds to the value of "1").

In FIG. 2, step 33, the functional auxiliary cells for each dimension are selected. Specifically, the processor 12 (in FIG. 3) selects a combination of functional auxiliary cells that satisfy the specification of the semiconductor device based on the number and the total area of the auxiliary representative cells obtained in step 32, and the integrated characteristic (characteristic value x number of used cells). The area of each auxiliary cell is related to its characteristics.

There exists scenarios in relation with the type, number, and total area of the auxiliary cells, where the following can be confirmed. If the ratio of the logic cells A in the semiconductor device is low, the number and area of the relatively large auxiliary cells is large, and the area of the relatively small auxiliary cells is small. On the other hand, if the ratio of the logic cells A to a cells in the semiconductor device is high, the number and area of relatively large auxiliary cells is small, and the number and area of relatively small auxiliary cells is large.

Based on the above scenarios, the processor 12 selects the combination of the auxiliary cells. For example, if the number or area of the auxiliary cells decreases as their dimensions decrease (i.e., the number of the relatively large auxiliary cells being high), a combination of relatively large capacitance cells E3, E4 and other relatively small auxiliary cells (e.g., master bulk cells C1) is selected. On the other hand, if the number or area of the auxiliary cells increases as their dimensions decrease, a combination of relatively small capacitance cells E1, E2 and other relatively large auxiliary cells (e.g., master bulk cells C2) is selected.

Then, the processor 12 determines the number and area of the auxiliary cells to be laid out in the semiconductor device so that the specification of the semiconductor device is satisfied. For example, the number of master bulk cells C1, C2 is determined in accordance with the logic circuit area of the semiconductor device. If the entire circuit area of the semiconductor device, or the area of newly added circuits is large, the number of master bulk cells C1, C2, which is required to make design corrections, is also large. The average line length determines the number of the diode cells D1, D2. Further, the circuit scale of the semiconductor device and the power line capacitance determine the respective numbers of the capacitance cells and the filter cells.

In step 34, of FIG. 2, the auxiliary cells are laid out automatically. Specifically, for example, in FIG. 5 the processor 12 deletes the temporarily laid out dummy cells X1, X3, X4. Then, the layout order of the auxiliary cells is determined in accordance with the type and dimension of the auxiliary cells. Each auxiliary cell selected in step 33 is laid out in accordance with its size. Step 34 is performed automatically in accordance with the layout program.

In step 35, the auxiliary cells are exchanged. Specifically, (FIG. 5) the processor 12 exchanges the temporarily laid out dummy cells X1, X3, X4 with the auxiliary cells selected in step 33 of FIG. 2 (e.g., the capacitance cells E3, E4). The dummy cells X1, X3, X4 are exchanged with auxiliary cells having the same size. For example, the dummy cells X4 are exchanged with the capacitance cells E3 in FIG. 6. Accordingly, after performing the cell exchange, as shown in FIG. 6, the layout 42 of a semiconductor device has the desirable combination and number of the auxiliary cells.

In accordance with the number and area of each type and size of auxiliary cell obtained in step 32 (i.e., the function of the logic cells A and vacant areas of the semiconductor device), the processor 12 determines which step, 34 or 35, has a shorter processing time, or is less difficult to process. The processor 12 then performs the selected step, 34 or 35.

The layout design method for the preferred embodiment has the following advantages:

(1) The processor 12 temporarily lays out the dummy cells X1–X5 largest to smallest in the vacant areas, and obtains the number and area of each temporarily laid out dummy cell X1–X5. Then, the processor 12 selects the combination of auxiliary cells that satisfies the specification of the semiconductor device based on the number and area used for each size, and the integrated characteristic value of each auxiliary cell. The processor 12 then lays out the selected auxiliary cells. Accordingly, auxiliary cells satisfying specifications of the semiconductor device are laid out in the vacant areas.

(2) By performing the step 34 or 35, auxiliary cells are appropriately laid out in the vacant areas.

It should be apparent to those skilled in the art that the present invention may be embodied in many other forms without departing from the principle or scope of the invention. Particularly, it should be understood that the present invention may be embodied in the following forms.

Instead of temporarily laying out dummy cells X1–X5 as the representative cells, any one of the plurality of auxiliary cell groups (e.g., capacitance cells E1–E4 or filter cells F1–F4) may be used as the representative cells.

The number of the dummy cells X1–X5, which are included in the sixth auxiliary-cell-group 26, does not have to be five.

A plurality of computers may be employed to perform steps 31–35. Additional hardware can be used to perform steps 31–35.

In cell library 16a, instead of storing the spacer cells B, which only have one size, spacer cells having two or more different sizes may be stored in the cell library 16a.

Instead of storing a program for processing of an embodiment storage medium 19 (e.g., a memory card, a floppy disk, an optical disk, a CD-ROM or a DVD-ROM, magneto-optical disks, an MO or an MD), a user may transfer program data via an information transfer apparatus, such as a network or a satellite. For example, a transmission media, such as a transmission wave, superimposing the computer program data of the present invention may be employed.

The present examples and embodiments are to be considered as illustrative and not restrictive, and the invention is not to be limited to the details given herein, but may be modified within the scope and equivalence of the appended claims.

What is claimed is:

1. A method for laying out at least one auxiliary cell in a vacant area that is not occupied by a logic cell in a semiconductor device, wherein each auxiliary cell includes at least one representative auxiliary cell and each auxiliary cell has a predetermined dimension, the method comprising:

temporarily arranging each representative auxiliary cell in the vacant area;

calculating a number of the arranged representative auxiliary cells and a total area of the arranged representative auxiliary cells;

selecting at least one auxiliary cell based on the calculated number, the calculated total area, and a specification of the semiconductor device; and arranging the selected at least one auxiliary cell in place of the arranged representative auxiliary cells.

2. The method according to claim 1, wherein said arranging the selected at least one auxiliary cell includes selecting a functional auxiliary cell for each of the temporarily arranged representative auxiliary cells.

3. The method according to claim 1, wherein said temporarily arranging each representative auxiliary cell is carried out by way of arranging representative auxiliary cells largest to smallest in dimension.

4. The method according to claim 1, wherein the auxiliary cells are registered in a cell library and dummy cells are used for temporary arrangement, and wherein each of the dummy cells has only dimension-related data.

5. The method according to claim 1, wherein said arranging the selected at least one auxiliary cell includes one of the following:
arranging the selected auxiliary cells; or
exchanging the temporarily arranged representative auxiliary cells with the selected auxiliary cells, wherein the exchanged representative auxiliary cells have the same dimensions as the selected auxiliary cells.

6. The method according to claim 5, further comprising deleting the temporarily arranged representative auxiliary cells.

7. An apparatus for laying out at least one auxiliary cell in a vacant area that is not occupied by a logic cell in a semiconductor device, wherein each auxiliary cell includes at least one representative auxiliary cell and each auxiliary cell has a predetermined dimension, the apparatus comprising a processor for performing:
temporarily arranging each representative auxiliary cell in the vacant area;
calculating a number of the arranged representative auxiliary cells and a total area of the arranged representative auxiliary cells;
selecting at least one auxiliary cell based on the calculated number, the calculated total area, and a specification of the semiconductor device; and
arranging the selected at least one auxiliary cell in place of the arranged representative auxiliary cells.

8. The apparatus according to claim 7, wherein said arranging the selected at least one auxiliary cell further comprises selecting, by the processor, a functional auxiliary cell for each of the temporarily arranged representative auxiliary cells.

9. The apparatus according to claim 7, wherein the processor temporarily arranges the representative auxiliary cells largest to smallest in dimension.

10. The apparatus according to claim 7, further comprising a cell library registering the auxiliary cells, wherein the auxiliary cells include dummy cells used for a temporary arrangement and wherein each of the dummy cells has only dimension-related data.

11. The apparatus according to claim 7, wherein the processor performs one of the following steps:
arranging the selected auxiliary cells; or
exchanging the temporarily arranged representative auxiliary cells with the selected auxiliary cells, wherein the exchanged representative auxiliary cells have the same dimensions as the selected auxiliary cells.

12. The apparatus according to claim 11, wherein the processor deletes the temporarily arranged representative auxiliary cells.

13. A computer readable storage medium for storing a program that lays out at least one auxiliary cell in a vacant area that is not occupied by a logic cell in a semiconductor device, wherein each auxiliary cell includes at least one representative auxiliary cell and each auxiliary cell has a predetermined dimension, the program performing a process of:
temporarily arranging each representative auxiliary cell in the vacant area;
calculating a number of the arranged representative auxiliary cells and a total area of the arranged representative auxiliary cells;
selecting at least one auxiliary cell based on the calculated number, the calculated total area, and a specification of the semiconductor device; and
arranging the selected at least one auxiliary cell in place of the arranged representative auxiliary cells.

14. The computer readable storage medium according to claim 13, wherein the program selects a functional auxiliary cell for each of the temporarily arranged representative auxiliary cells during said arranging the selected at least one auxiliary cell.

15. The computer readable storage medium according to claim 13, wherein the program temporarily arranges the representative auxiliary cells largest to smallest in dimension.

16. The computer readable storage medium according to claim 13, wherein the program performs one of:
arranging the selected auxiliary cells; or
exchanging the temporarily arranged representative auxiliary cells with the selected auxiliary cells, wherein the exchanged representative auxiliary cells have the same dimensions as the selected auxiliary cells.

17. The computer readable storage medium according to claim 16, wherein the program deletes the temporarily arranged representative auxiliary cells.

18. A computer readable transmission medium including a program code that lays out at least one auxiliary cell in a vacant area that is not occupied by a logic cell in a semiconductor device, wherein each auxiliary cell includes at least one representative auxiliary cell and each auxiliary cell has a predetermined dimension, the program code performing a process of:
temporarily arranging each representative auxiliary cell in the vacant area;
calculating a number of the arranged representative auxiliary cells and a total area of the arranged representative auxiliary cells;
selecting at least one auxiliary cell based on the calculated number, the calculated total area, and a specification of the semiconductor device; and
arranging the selected at least one auxiliary cell in place of the arranged representative auxiliary cells.

19. The computer readable storage medium according to claim 18, wherein the program code selects a functional auxiliary cell for each of the temporarily arranged representative auxiliary cells during said arranging the selected at least one auxiliary cell.

20. The computer readable storage medium according to claim 18, wherein the program code temporarily arranges the representative auxiliary cells largest to smallest in dimension.

21. A method for laying out at least one auxiliary cell in a vacant area that is not occupied by a logic cell in a semiconductor device, wherein each auxiliary cell includes at least one representative auxiliary cell and each auxiliary cell has a predetermined dimension, the method comprising:
temporarily arranging each representative auxiliary cell largest to smallest in dimension, in the vacant area;
calculating a number of the arranged representative auxiliary cells and a total area of the arranged representative auxiliary cells;
selecting at least one auxiliary cell based on the calculated number, the calculated total area, and a specification of the semiconductor device; and
arranging the selected at least one auxiliary cell in place of the arranged representative auxiliary cells.

22. The method according to claim 21, wherein the auxiliary cells are registered in a cell library and include dummy cells used for a temporary arrangement, and wherein each of the dummy cells has only dimension-related data.

23. The method according to claim 21, wherein said arranging the selected at least one auxiliary cell includes one of the following:

arranging the selected auxiliary cells; or exchanging the temporarily arranged representative auxiliary cells with the selected auxiliary cells, wherein the exchanged representative auxiliary cells have the same dimensions as the selected auxiliary cells.

24. A method for laying out a plurality of auxiliary cells in a vacant area that is not occupied by a logic cell in a semiconductor device, wherein the plurality of auxiliary cells include at least one functional auxiliary cell, and the auxiliary cells are categorized into a plurality of groups based on a plurality of dimensions, the method comprising:

temporarily arranging one or more representative auxiliary cells in the vacant area;

calculating a number of the arranged representative auxiliary cells and a total area of the arranged representative auxiliary cells;

selecting one or more of the functional auxiliary cells based on the calculated number, the calculated total area, and a specification of the semiconductor device; and arranging the selected one or more functional auxiliary cells in place of the arranged representative auxiliary cells.

25. An apparatus for laying out a plurality of auxiliary cells in a vacant area that is not occupied by a logic cell in a semiconductor device, wherein the plurality of auxiliary cells include at least one functional auxiliary cell, and the auxiliary cells are categorized into a plurality of groups based on a plurality of dimensions, the apparatus comprising a processor performing a process of:

temporarily arranging one or more representative auxiliary cells in the vacant area;

calculating a number of the arranged representative auxiliary cells and a total area of the arranged representative auxiliary cells;

selecting one or more of the functional auxiliary cells based on the calculated number, the calculated total area, and a specification of the semiconductor device; and arranging the selected one or more functional auxiliary cells in place of the arranged representative auxiliary cells.

26. A computer readable storage medium for storing a program that lays out a plurality of auxiliary cells in a vacant area that is not occupied by a logic cell in a semiconductor device, wherein the plurality of auxiliary cells include at least one functional auxiliary cell, and the auxiliary cells are categorized into a plurality of groups based on a plurality of dimensions, the program performing a process of:

temporarily arranging one or more representative auxiliary cells in the vacant area;

calculating a number of the arranged representative auxiliary cells and a total area of the arranged representative auxiliary cells;

selecting one or more of the functional auxiliary cells based on the calculated number, the calculated total area, and a specification of the semiconductor device; and arranging the selected one or more functional auxiliary cells in place of the arranged representative auxiliary cells.

* * * * *